United States Patent [19]

Sugiyama et al.

[11] Patent Number: 4,690,529
[45] Date of Patent: Sep. 1, 1987

[54] OPTICAL EXPOSER

[75] Inventors: Shuji Sugiyama; Shuji Syohda, both of Katsuta; Shinji Kuniyoshi, Suginami, all of Japan

[73] Assignee: Hitachi, Ltd., Tokyo, Japan

[21] Appl. No.: 741,800

[22] PCT Filed: Oct. 3, 1984

[86] PCT No.: PCT/JP84/00467
§ 371 Date: Aug. 5, 1985
§ 102(e) Date: Aug. 5, 1985

[87] PCT Pub. No.: WO85/01834
PCT Pub. Date: Apr. 25, 1985

[30] Foreign Application Priority Data

Oct. 7, 1983 [JP] Japan .............................. 58-187025

[51] Int. Cl.⁴ ............................................. G03B 27/52
[52] U.S. Cl. ..................................... 353/122; 33/613; 353/101; 355/43
[58] Field of Search ................................ 353/122, 101; 355/55–57, 43, 66, 65, 73, 45; 33/180 R, 286

[56] References Cited

U.S. PATENT DOCUMENTS 3,844,655 10/1974 Johannsmeier ..................... 355/43
4,367,046 1/1983 Lacombat ........................ 355/53 X
4,414,749 11/1983 Jöhannsmeier ................... 33/180 R Primary Examiner—Harry N. Haroian
Attorney, Agent, or Firm—Antonelli, Terry & Wands

[57] ABSTRACT

This invention relates to an optical exposer wherein a predetermined pattern is projected onto a work piece through a projector lens, and an alignment mark on the work piece is detected through the projector lens. It is desirable that a detection waveform of the alignment mark will not be deformed. Since the wave deformation is due to distortion of the alignment light, a first wavelength light and a second wavelength light are used as the alignment light to reduce the distortion effect.

16 Claims, 10 Drawing Figures

OPTICAL EXPOSER

TECHNICAL FIELD

This invention relates to an optical exposer, and is particularly concerned with an optical exposer wherein a predetermined pattern is projected onto a work piece such as semiconductor wafer or the like through a projector lens, and an alignment mark put on the work piece is detected through the projector lens.

BACKGROUND ART

In an optical exposer for projecting and transferring a predetermined pattern onto a work piece through a projector lens, there prevails a superposed exposure whereby a plurality of predetermined patterns are projected successively and so transferred onto the work piece. However, such superposed exposure calls for strict precision hence, a correcting or realignment must be carried out.

For this positional correction, a common method employed is a technique wherein an alignment mark is formed on the work piece, and the alignment mark is detected through a projector lens. With this technique, the alignment mark is detected as an electrical signal waveform, therefore a position of the alignment mark is determined by the electrical signal waveform.

However, according to the inventor's experimental research, the electrical signal waveform detected is not actually a true electrical signal waveform representation of the alignment mark; consequently, it has been found that an accurate positioning of the alignment mark cannot be decided easily. As a result of the inventor having further studied the cause, it has been found that a projector lens is normally designed so as to use a monochromatic light only for enhancing the resolving power of the exposure; consequently, said monochromatic light must be used also as the light for detecting the alignment mark; therefore, there is distortion of the light due to the non-uniform thickness of a resist film formed on the surface of the work piece, the thickness of which is roughly the same as the wavelength of the monochromatic light; thus, the electrical signal waveform of the alignment is distorted to a considerable degree.

DISCLOSURE OF INVENTION

An object of this invention is to provide an optical exposer suitable for solving the problem of placing the alignment mark correctly in position due to the light distortion.

According to this invention, there is provided an optical exposer comprising a means for generating a light, a means for orienting the light toward a predetermined pattern, a projector lens for producing an image of the predetermined pattern on a work piece provided with an alignment mark, and a means for detecting the focused image of the alignment mark in first and second light wavelengths through the projector lens.

BEST MODE FOR CARRYING OUT THE INVENTION

Figure 1:
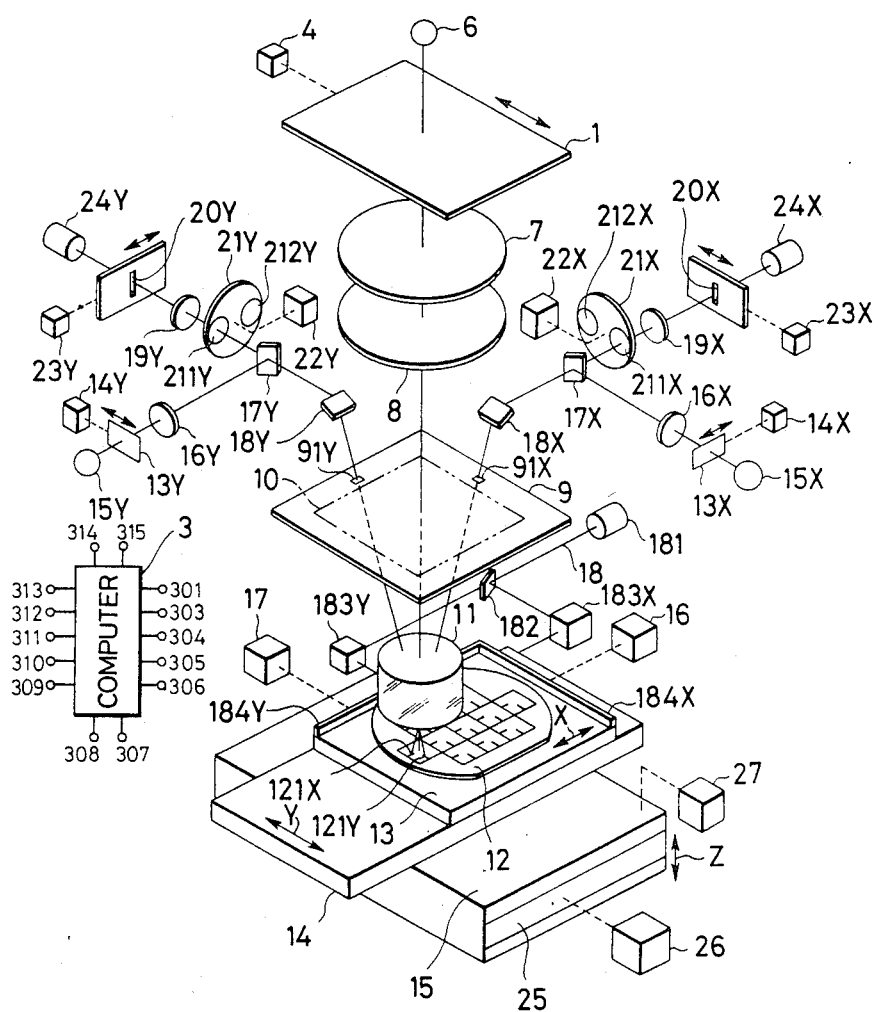
FIG. 1 is a perspective view of an optical exposer given in one embodiment of this invention.

FIG. 1 represents one embodiment of this invention. Referring to the drawing, a shutter 1 opens during exposure and closes during alignment. Such operation of the shutter 1 is controlled by giving a command to a driving device 4 from a computer 3 through a terminal 301.

While the shutter 1 opens, a light from a light source 6 consisting of a mercury-vapor lamp irradiates a filter 8 through a lens 7. The filter 8 selects only a ray g (light wavelength being 4,358 Å), and the ray g irradiates a mask 9 as an exposure light. The mask 9 includes a reticle, but is not necessarily limited to this configuration. This reservation applies likewise the scope of the claims. The mask 9 has a predetermined pattern 10, and the pattern is projected onto a work piece 12 such as a semiconductor wafer through a monochromatic light projector lens 11 by means of the ray g. Thus, an image of the pattern 10 of the mask 9 is produced on the work piece 12.

The work piece 12 is supported on a moving bed 13, the moving bed 13 is supported on a moving bed 14, and the moving bed 14 is supported on a moving bed 15. The moving bed 14 is shifted in increments in the X-axis direction by a driving device 16, the moving bed 14 is also shifted in increments in the Y-axis direction by a driving device 17; thus, the work piece 12 is shifted in increments; two-dimensionally, therefore the pattern 10 of the mask 9 is projected and so transferred entirely on the work piece 12. The driving devices 16 and 17 are controlled by having a command given thereto from the computer 3 through terminals 303 and 304.

A position measuring device 18 comprises a laser light source 181, a half-mirror 182, interferometers 183X and 183Y, and mirrors 184X and 184Y mounted on the moving bed 13. The interferometers 183X and 183Y measure positiions of the work piece 12 in the directions of X-axis and Y-axis of an area where the pattern 9 is to be transferred, and position signals in the directions of X-axis and Y-axis thus measured are loaded in the computer 3 through terminals 305 and 306.

The computer 3 decides whether the measured positions in the directions of X-axis and Y-axis coincide with the predetermined positions in the directions of X-axis and Y-axis, and if there is a difference between them, the driving devices 16 and 17 are controlled so as to compensate the difference through the terminals 303 and 304.

The work piece 12 has alignment marks 121X and 121Y in the directions of X-axis and Y-axis, and the mask 9 has also alignment marks 91X and 91Y in the directions of X-axis and Y-axis.

Shutters 13X and 13Y open during alignment prior to exposure and close during exposure. The operation above is so controlled by driving devices 14X and 14Y, and the driving devices are controlled on a command given by the computer 3 through terminals 307 and 308.

While the shutters 13X and 13Y open, lights from light sources 15X and 15Y consisting of a mercury-vapor lamp each irradiate the alignment marks 121X and 121Y through lenses 16X and 16Y, half-mirrors 17X and 17Y, deflection mirrors 18X and 18Y, the alignment marks 91X and 91Y, and the projector lens 11.

A focused image of the alignment marks 121X and 121Y according to the ray g is produced at positions of the alignment marks 91X and 91Y and further produced at positions of slits 20X and 20Y by lenses 19X and 19Y through the deflection mirrors 18X and 18Y and the half-mirrors 17X and 17Y together with a focused image of the alignment marks 91X and 91Y.

The slits 20X and 20Y are scanned in the direction indicated by an arrow by driving devices 23X and 23Y controlled by the computer 3 through terminals 311 and 312, and thus a focused image of the alignment marks 121X and 121Y according to the ray g which is produced at positions of the slits 20X and 20Y and a focused image of the alignment marks 91X and 91Y according to the ray g are detected by detectors 24X and 24Y each consisting of a photomultiplier.

Filter units 21X and 21Y are disposed between the half-mirrors 17X and 17Y and the lenses 19X and 19Y, and these are provided with filters 211X and 211Y, and 212X and 212Y. The filters 211X and 211Y and the filters 212X and 212Y are selectively changed and inserted in an optical path by driving devices 22X and 22Y, and the driving devices 22X and 22Y are controlled by having a command given thereto from the computer 3 through terminals 309 and 310. The filters 211X and 211Y are transferred and inserted currently into the optical path. The filters 211X and 211Y permit the ray g to pass and cut those filters of other wavelengths. Accordingly, only focused images of the alignment marks 121X and 121Y and 91X and 91Y according to the ray g which are produced at positions of the slits 20X and 20Y are detected by the detectors 24X and 24Y.

A wedge-like moving bed 25 is shifted in the direction of Z-axis by a driving device 26 controlled by the computer 3 through a terminal 313. The moving bed 15 and the work piece 12 consequently are shifted also in the direction of Z-axis thereby. Positions of the moving bed 15 and the work piece 12 consequently in the direction of Z-axis are measured by a position measuring device 27, and the measured position signals are loaded in the computer 3 through a terminal 314. A known magnetic scale, air micrometer, interferometer and the like can be used as the position measuring device. The computer 3 compares the measured position in the direction of Z-axis with a preset position, and then controls the driving device 26 so as to remove a difference, if any, between both the two. The computer 3 is capable of setting the work piece 12 at predetermined two positions. The first position is that by which the focused image of the alignment marks 121X and 121Y according to the ray g is produced at a position of the alignment marks 91X and 91Y, and the second position is that by which the focused image of the alignment marks 121X and 121Y according to the ray e (light wavelength being 5,461 Å, is produced at a position of the alignment marks 91X and 91Y, namely a position whereby focused images of the alignment marks 121X and 121Y and 91X and 91Y are produced at a position of the slits 20X and 20Y.

During the period in which the focused images of the alignment marks 121X and 121Y and 91X and 91Y according to the ray g must be produced at the position of the slits 20X and 20Y, the work piece 12 is set at the first position.

On the other hand, in case the focused images of the alignment marks 121X and 121Y and 91X and 91Y according to the ray e are produced at the position of the slits 20X and 20Y, the work piece 12 is set at the second position, and the filters 211X and 211Y are replaced by the filters 212X and 212Y in the optical path. The filters 212X and 212Y are those of permitting the ray e to pass and cutting other wavelength lights. The second position comes 130 μm below the first position.

When the work piece 12 is held at the second position, the focused image of the alignment marks 121X and 121Y according to the ray e is produced at the position of the alignment marks 91X and 91Y by the projector lens 11 and is further produced at the position of the slits 20X and 20Y by the lenses 19X and 19Y through the deflection mirrors 18X and 18Y, the half-mirrors 17X and 17Y together with the focused image of the alignment marks 91X and 91Y. The filters 212X and 212Y are transferred and inserted into the optical path, therefore when the slits 20X and 20Y are scanned in the direction indicated by an arrow, only the focused images of the alignment marks 121X and 121Y and 91X and 91Y according to the ray e which are produced at the position of the slits 20X and 20Y are detected by the detectors 24X and 24Y.

Figure 2:
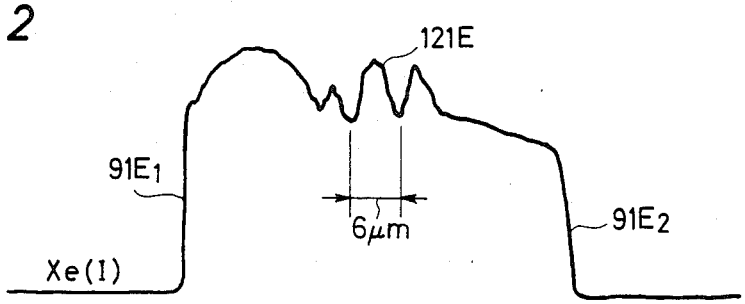
FIG. 2 is a drawing showing an electrical signal waveform of an alignment mark through a ray g.

FIG. 2 shows an electrical signal waveform Xe (I) of the focused image of alignment marks 121 and 91 according to the ray g which is detected by a detector 24. Edges $91E_1$ and $91E_2$ correspond to opposite edges of the window-type alignment mark 91, and 121E indicates a pattern of the alignment mark 121. A difference between the center position of the edges $91E_1$ and $91E_2$ and the center position of the pattern 121E represents a relative error between the work piece 12 and the mask 9 which must be corrected. As will be apparent from the drawing, the pattern 121E is deformed; hence, it is difficult to get the correct center position.

Figure 3:
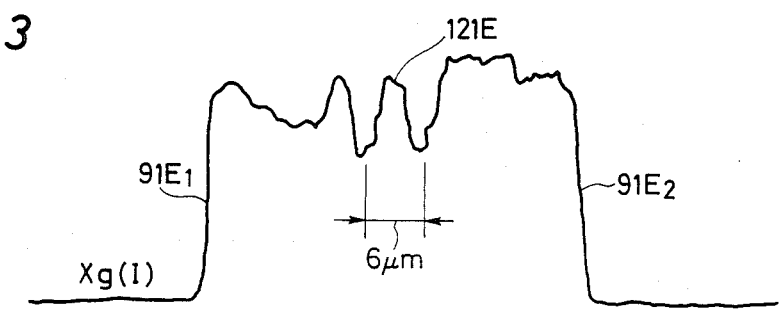
FIG. 3 is a drawing showing an electrical signal waveform of the alignment mark through a ray e.

FIG. 3 represents an electrical signal waveform Xg(I) of the focused image of the alignment marks 121 and 91 according to the ray e. As in the case of FIG. 2, it is difficult to decide the center position of the pattern 121E in this case.

Where the work piece 12 is a semiconductor wafer, a mean film thickness of the photoresist which is the uppermost surface layer is generally 14,000 Å and the film thickness distribution is ±1,000 Å or so due to LOCOS (Local Oxidation of Silicon) existing near the alignment mark, therefore light may be distorted by variations in the film thickness, which makes it difficult to determine the correct center position of the pattern 121E of the alignment mark 121.

Figure 4:
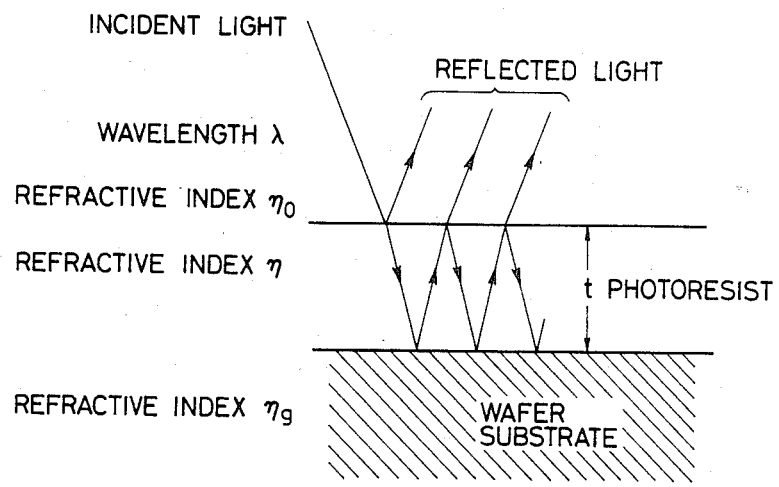
FIG. 4 is an explanatory drawing of the light distortion effect.

Referring in detail to this point, a transparent film such as a photoresist on the wafer which is as thin as a single wavelength of light is called an optical thin film, and as shown in FIG. 4, reflected light from the transparent film surface and the wafer substrate and reflected light through a repeated reflection in the transparent film interfere with each other thereby distorting the light beam. The intensity of the reflected light in this case will be given by the following expression:

$$E = 1 - \frac{4n_o n^2 n_g}{n^2(n_o + n_g^2) - (n_g^2 - n^2)(n^2 - n_o^2)\sin^2\left(\frac{\gamma}{2}\right)} \quad (1)$$

where $\gamma = 4n\pi t/\lambda$, 1 is incident light intensity, $n_o$ is the refractive index of air, n is the refractive index of the photoresist, $n_g$ is the refractive index of the substrate, $\lambda$ is light intensity, and t is thickness of the photoresist.

Figure 5:
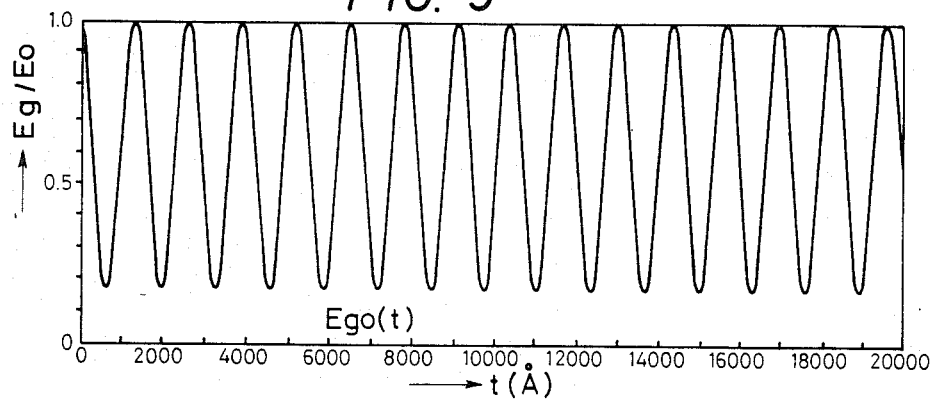
FIG. 5 is a drawing showing the relation of relative reflected light intensity to the thickness of photoresist due to distortion of the ray g.

FIG. 5 shows the relation of relative reflected light intensity $E_g/E_o$ to the thickness t of the photoresist where AZ1350J manufactured by the Shipley Corporation (U.S.) is used as the photoresist, the refractive index of the air is $n_o = 1$, the refractive index of the wafer substrate is $n_g = 4.86$, the reflected light intensity according to the distortion of the ray g given by the expression (1) is indicated by $E_g$, and reflected light intensity due to the wafer substrate without the photoresist is indicated by $E_o = \{(n_o - n_g)/(n_o + n_g)\}^2$. From FIG. 5, the relative reflected light intensity is a period function $E_{go}(t)$ of the thickness t, and it is found that the relative reflected light intensity sharply fluctuates where the thickness t of the photoresist falls roughly within 14,000 Å. The sharp fluctuation of the relative reflected light intensity makes it difficult to decide the correct center position of the pattern 121E.

Figure 6:
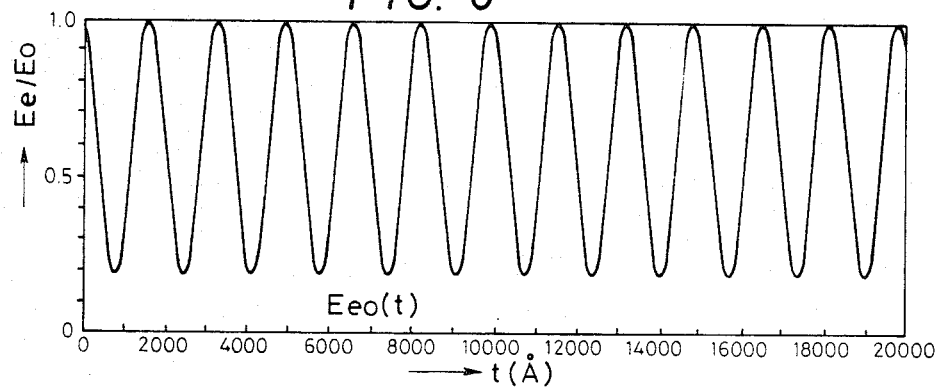
FIG. 6 is a drawing showing the relation of a relative reflected light intensity to the thickness of the photoresist due to a distortion of the ray e.

FIG. 6 shows the relation of a relative reflected light intensity $E_e/E_o$ ($E_e$ representing a reflected light intensity due to distortion of the ray e which is given by the expression (1); $E_o$ representing reflected light intensity due to the wafer substrate without the photoresist) to the thickness t of the photoresist which is obtained through using the ray e as an alignment wavelength under the same conditions whereby data of FIG. 5 is obtained. As in the case of FIG. 5, the relative reflected light intensity is a period function $E_{eo}(t)$ of the thickness t, and it is apparent that the relative reflected light intensity sharply fluctuates where the thickness of the photoresist falls within 14,000 Å ± 1,000 Å. The sharp fluctuation makes it difficult to decide the correct center position of the pattern 121E.

Figure 7:
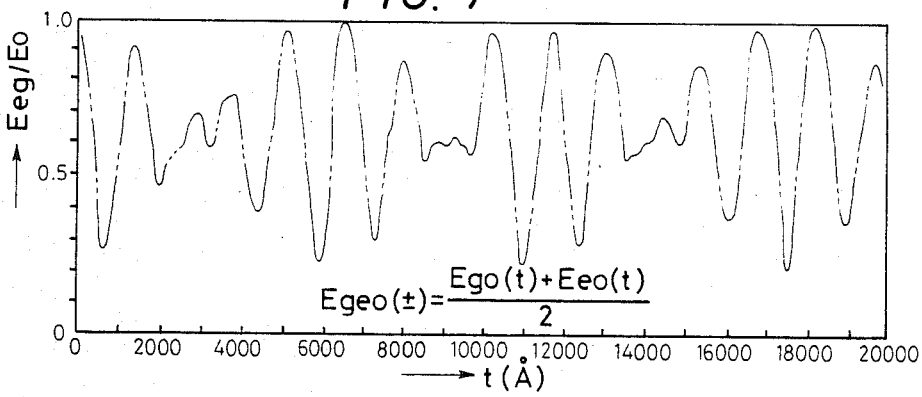
FIG. 7 is a drawing showing a relation of a mean relative reflected light intensity to the thickness of photoresist due to the rays g and e.

FIG. 7 shows the relation of mean relative reflected light intensity $E_{eg}/E_o$ obtained through averaging the relative reflected light intensities of FIG. 5 and FIG. 6 to the thickness t of the photoresist. That is, if the function of FIG. 7 is $E_{geo}(t)$, then $E_{geo}(t)$ can be given by $E_{geo}(t) = [E_{geo}(g) + E_{eo}(t)]/2$. As will be apparent from the drawing, fluctuation of the mean relative reflected light intensity sharply decreases where the thickness t of the photoresist falls within 14,000 Å ± 1,000 Å. In fact, the decrease is essential to correctly determining of the position of the pattern 121E.

In view of this point, in the embodiment of FIG. 1, electrical signals $X_g(I)$ and $X_e(I)$ of the focused image of the alignment marks 121 and 91 which are detected by the detector 24 are loaded in the computer 3 through terminals 314 and 315, where they are subjected to bypass processing and then averaged.

Bypass processing is that for removing skew and large undulations from the waveform, and a bypass-processed waveform $X_{gh}(I)$ relating to $X_g(I)$ and a bypass-processed waveform $X_{eh}(I)$ relating to $X_e(I)$ are given by the following expressions:

$$X_{gh}(I) = X_{ga}(I) - X_{gb} \quad (2)$$

$$X_{eh}(I) = X_{ea}(I) - X_{eb} \quad (3)$$

$$X_{ga}(I) = [X_g(I-1) + X_g(I) + X_g(I+1)]/3$$

$$X_{gb}(I) = \left[\sum_{i=1}^{100} \{X_g(I-i) + X_g(I+i)\} + X_g(I)\right]/201$$

$$X_{ea}(I) = [X_e(I+1) + X_e(I) + X_e(I+1)]/3$$

$$X_{eb}(I) = \left[\sum_{i=1}^{100} \{X_e(I+i) + X_e(I+i)\} + X_e(I)\right]/201$$

The following averaging processing ensues from the above bypass processing.

$$X_{geh}(I) = [X_{gh}(I) + X_{eh}(I)]/2 \quad (4)$$

After such processing, the computer 3 computes a center $I_w$ of the detected pattern according to the following expression:

$$I_w = \left[\frac{(I_1 + I_2)}{2} + \frac{(I_3 + I_4)}{2}\right] \quad (5)$$

Here, $I_1$ to $I_4$ denote points whereat an averaging waveform $X_{geh}$ coincides with a predetermined level ML.

Figure 8:
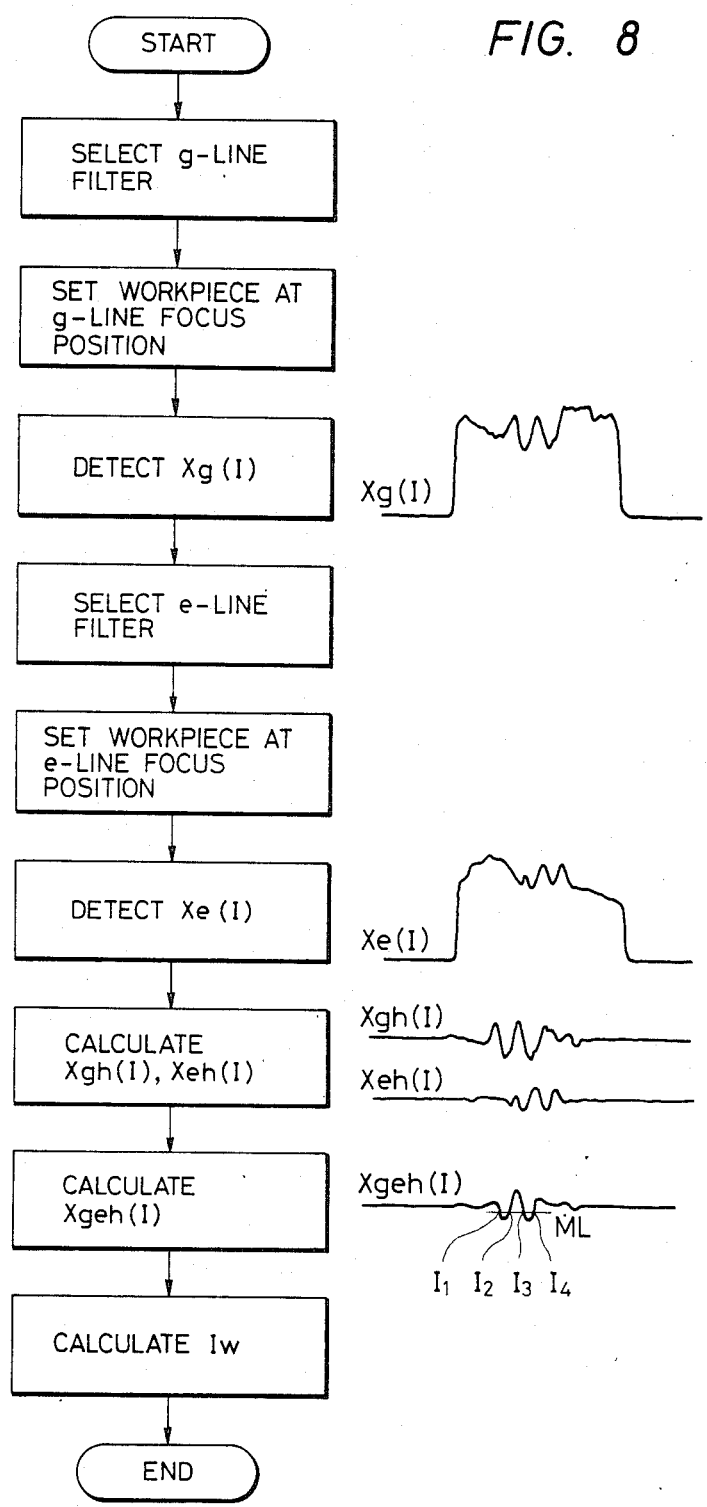
FIG. 8 is a drawing showing a motion flow of the embodiment of FIG. 1.

The above step for alignment is shown in a flow format as FIG. 8.

As will be apparent from the above description, according to the embodiment of FIG. 1, the correct position of the alignment mark according to the light interference effect will be reliably obtained.

Figure 9:
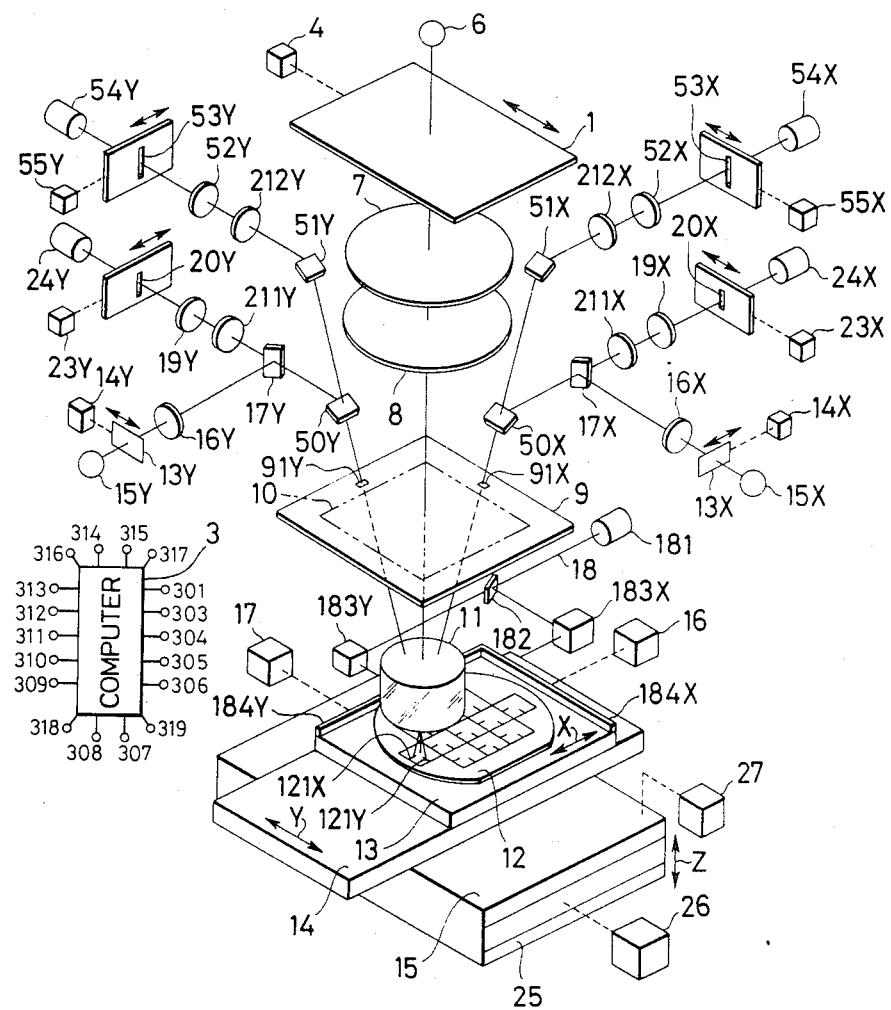
FIG. 9 is a perspective view of an optical exposer given in another embodiment of this invention.

FIG. 9 represents another embodiment of this invention. This embodiment is the same as that of FIG. 1 except that half-mirrors 50X and 50Y are used instead of the deflection mirrors 18X and 18Y, the ray g is transmitted so that the optical system covering the half-mirrors 50X and 50Y, the half-mirrors 17X and 17Y, the lenses 19X and 19Y, the slits 20X and 20Y and the detectors 24X and 24Y will work as an optical system for exclusive use on the ray g, the filters 211X and 211Y cutting other wavelengths are fixed in the optical path, the ray e is transmitted from the half-mirrors 50X and 50Y to the deflection mirrors 51X and 51Y as an optical system for exclusive use on the ray e, the optical system covering the filters 212X and 212Y cutting other wavelength lights, lenses 52X and 52Y, slits 53X and 53Y, and detectors 54X and 54Y are provided additionally, detection output signals of the detectors 54X and 54Y are loaded in the computer 3 through terminals 316 and 317, and driving devices 55X and 55Y for scanning the slits are provided additionally, and the driving devices are controlled by the computer 3 through terminals 318 and 319.

In the embodiment, a focused image of the alignment pattern 121X and 121Y according to the ray g is produced at a position of the alignment marks 91X and 91Y and also produced at a position of the slits 20X and 20Y together with the focused image of the alignment marks 91X and 91Y, and those images are detected on the detectors 24X and 24Y by scanning the slits 20X and 20Y and then loaded in the computer 3 through the terminals 314 and 315.

The focused image of the alignment marks 121X and 121Y according to the ray e is produced at a position of the slits 53X and 53Y by the lenses 52X and 52Y through the alignment marks 91X and 91Y, the half-mirrors 50X and 50Y, the deflection mirrors 51X and 51Y, and the filters 212X and 212Y, and the focused image is detected on the detectors 54X and 54Y by scanning the slits 53X and 53Y. The detected image signal is then loaded in the computer 3 through the terminals 318 and 319.

Processing after detection outputs of the detectors 24X and 24Y and 54X and 54Y are loaded in the computer 3 is the same as what has been done in relation to FIG. 1. Accordingly, an effect similar to that by the embodiment of FIG. 1 can be expected from the embodiment of FIG. 9.

According to the embodiment of FIG. 2, in addition, a shift of the work piece between two positions in the direction of Z-axis as in the case of the embodiment of FIG. 1 is not necessary for the detection of alignment marks according to the rays g and e; hence, the time required for alignment can be shortened.

Figure 10:
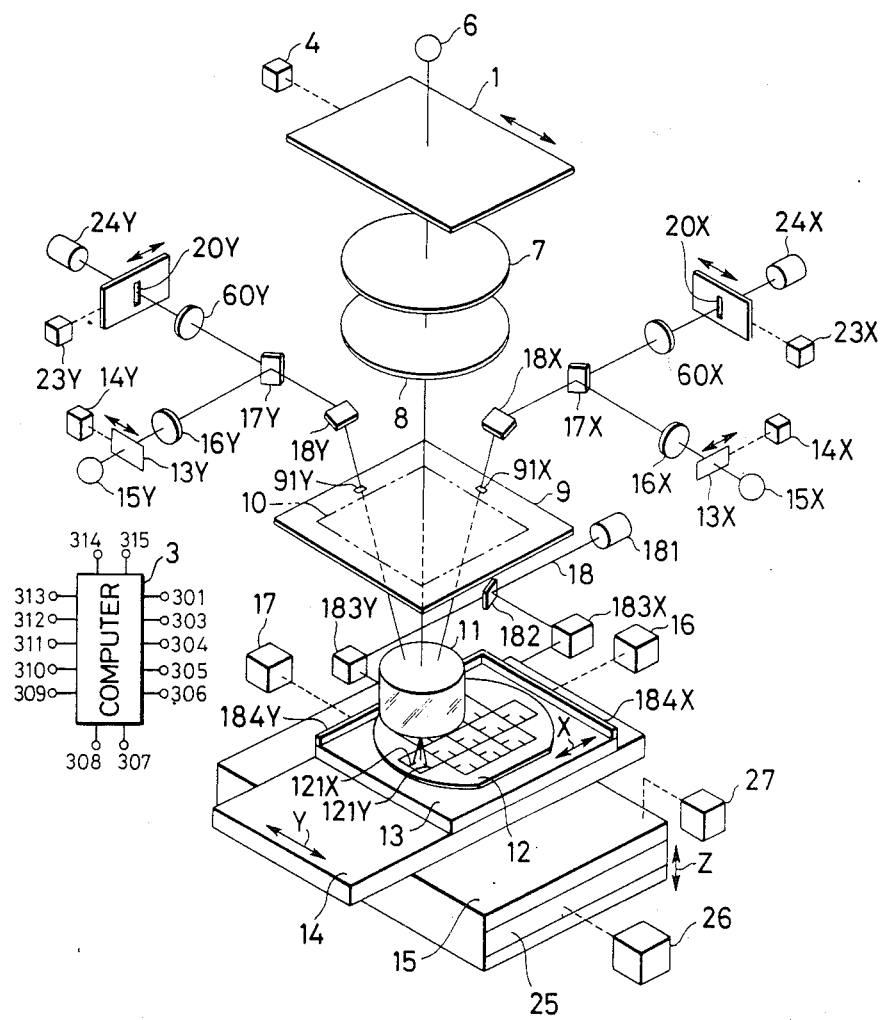
FIG. 10 is a perspective view of an optical exposer given in a further embodiment of the invention.

FIG. 10 represents a further embodiment of this invention. The embodiment is different from that of FIG. 1 in that the filter units 21X and 21Y in FIG. 1 are removed, and correction lenses 60X and 60Y are used instead of the lenses 19X and 19Y. According to the embodiment, the focused image of the alignment marks 121X and 121Y according to the ray g is produced at a position of the alignment marks 91X and 91Y and further produced by the correction lenses 60X and 60Y at a position of the slits 20X and 20Y together with the focused image of the alignment marks 91X and 91Y. Further, the focused image of the alignment marks 121X and 121Y according to the ray e is produced by the correction lenses 60X and 60Y at the position of the slits 20X and 20Y. Accordingly, the focused images of the alignment marks 121X and 121Y and 91X and 91Y according to the ray g and the focused image of the alignment marks 121X and 121Y are detected simultaneously on the detectors 24X and 24Y by scanning the slits 20X and 20Y. The detected image signals are loaded in the computer 3 to bypass processing, and the center position of alignment marks is calculated.

According to the embodiment of FIG. 10, the focused images of the alignment marks 121X and 121Y and 91X and 91Y according to the ray g and the focused image of the alignment marks 121X and 121Y according to the ray e are produced at the same position and also detected simultaneously on the same detectors, therefore an object in view can be attained likewise without electrical averaging processing in the embodiments of FIG. 1 and FIG. 9. Computation is consequently simplified, and the time required for alignment can be shortened.

Further, unlike that of FIG. 1, the embodiment is featured such that the work piece need not be shifted in the direction of Z-axis for detection of the alignment marks according to the rays g and e and an optical system for alignment can be comparatively simplified.

In the embodiments described above, two wavelength lights, namely the ray g and the ray e are used for alignment, however, the number may be three or more and the wavelength is not necessarily limited to those specifically described. For example, two or more of ray g (light wavelength being 4,358 Å), ray e (light wavelength being 5,461 Å), ray d (light wavelength being 5,769 Å, 5,791 Å), ray h (light wavelength being 4,047 Å) and ray i (3,655 Å) can be selected for use. Further, the projector lens 11 is not necessarily limited to a monochromatic light lens, and, for example, an achromatic lens for rays g and h can be employed.

Then, like reference characters represent like parts or equivalents in the different views of the drawings.

What is claimed is:

1. An optical projection exposure system comprising: means for generating light;
a mask having a predetermined pattern and at least one alignment mark;
means for directing said light to said mask;
a projection lens for projecting an image of said predetermined pattern onto a work piece, said work piece including at least one alignment mark; and
means for detecting a first superposed image of a first light wavelength composed of a first focused image of said at least one alignment mark of said work piece through said projection lens and said at least one alignment mark of said mask, and for detecting a second superposed image of a second wavelength composed of a second focused image of said at least one alignment mark of said work piece through said projection lens and said at least one alignment mark of said mask.

2. An optical projection exposure system according to claim 1, wherein said projection lens is achromatic for said first and second light wavelengths.

3. An optical projection exposure system according to claim 1, further comprising means for displacing the work piece so as to produce the first and second superposed images to be detected at a predetermined position.

4. An optical projection exposure system according to claim 1, further comprising means for producing said first and second superposed images to be detected at first and second predetermined positions, respectively, wherein said detecting means includes first and second detectors arranged so as to detect said first and second superposed images produced at said first and second predetermined positions, respectively.

5. An optical projection exposure system according to claim 1, further comprising means disposed between said mask and said detecting means for producing said first and second superposed images at a predetermined position, wherein said detecting means includes a single detector arranged so as to simultaneously detect the first and second superposed images.

6. An optical projection exposure system according to claim 3, further comprising means for disposing a slit at said predetermined position and for scanning said slit in a direction perpendicular thereto.

7. An optical projection exposure system according to claim 4, further comprising means for disposing a first slit at said first predetermined position and for scanning said first slit in a direction perpendicular thereto and means for disposing a second slit at said second predetermined position and for scanning said second slit in a direction perpendicular thereto.

8. An optical projection exposure system according to claim 5, further comprising means for disposing a slit at said predetermined position and for scanning said slit in a direction perpendicular thereto.

9. An optical projection exposure system comprising: means for generating light;
a mask having a predetermined pattern and at least one alignment mark;

means for directing said light to said mask to thereby transmit said light through said predetermined pattern of said mask;

a projection lens for projecting an image of said predetermined pattern onto a work piece, said work piece including at least one alignment mark; and means for detecting a first superposed image of a first light wavelength, composed of a first focused image of said at least one alignment mark of said work piece through said projection lens and said at least one alignment mark of said mask, and for detecting a second superposed image of a second light wavelength composed of a second focused image of said at least one alignment mark of said work piece through said projection lens and said at least one alignment mark of said mask.

10. An optical projection exposure system according to claim 9, wherein said projection lens is achromatic for said first and second light wavelengths.

11. An optical projection exposure system comprising:

means for generating light;

a mask having a predetermined pattern and at least one alignment mark;

means for directing said light to said mask to thereby transmit said light through said predetermined pattern of said mask;

a projection lens for projecting an image of said predetermined pattern onto a work piece having at least one alignment mark;

means for detecting a first superposed image of a first light wavelength, composed of a first focused image of said at least one alignment mark of said work piece through said projection lens and said alignment mark of said mask, and for detecting a second superposed image of a second light wavelength, composed of a second focused image of said at least one alignment mark of said work piece through said projection lens and said at least one alignment mark of said mask, said detecting means converting the detected first and second superposed images into first and second electric signals corresponding thereto, respectively; and means for averaging the converted first and second electric signals.

12. An optical projection exposure system according to claim 11, wherein said projection lens is achromatic for said first and second light wavelengths.

13. An optical projection exposure system according to claim 11, further comprising means for displacing said work piece so as to produce said first and second superposed images to be detected at a predetermined position.

14. An optical projection exposure system according to claim 13, further comprising means for disposing a slit at said predetermined position and for scanning said slit in a direction perpendicular thereto.

15. An optical projection exposure system according to claim 11, further comprising means for producing said first and second superposed images to be detected at first and second positions, respectively, wherein said detecting means includes first and second detectors arranged so as to detect said first and second superposed images produced at said first and second predetermined positions respectively, and to produce said first and second electric signals corresponding to said detected first and second superposed images, respectively.

16. An optical projection exposure system according to claim 15, further comprising means for disposing a first slit at said first predetermined position and for scanning said first slit in a direction perpendicular thereto and means for disposing a second slit at said second predetermined position and for scanning said second slit in a direction perpendicular thereto.

* * * * *